(12) United States Patent
Lee et al.

(10) Patent No.: US 7,198,823 B2
(45) Date of Patent: Apr. 3, 2007

(54) SILOXANE-BASED RESIN CONTAINING GERMANIUM AND AN INTERLAYER INSULATING FILM FOR A SEMICONDUCTOR DEVICE USING THE SAME

(75) Inventors: Sang Kyun Lee, Gyeonggi-Do (KR); Jong Baek Seon, Gyeonggi-Do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/342,562

(22) Filed: Jan. 31, 2006

(65) Prior Publication Data

US 2006/0141269 A1    Jun. 29, 2006

Related U.S. Application Data

(62) Division of application No. 10/734,179, filed on Dec. 15, 2003, now Pat. No. 7,057,002.

(30) Foreign Application Priority Data

Jul. 14, 2003    (KR) .............................. 2003-47731

(51) Int. Cl.
*B05D 3/02* (2006.01)
(52) U.S. Cl. .................. 427/387; 428/447; 106/122; 521/61
(58) Field of Classification Search ............... 477/387; 428/447; 106/122; 521/61
See application file for complete search history.

(56) References Cited

U.S. PATENT DOCUMENTS

| | | | |
|---|---|---|---|
| 3,615,272 A | 10/1971 | Collins et al. | |
| 4,399,266 A | 8/1983 | Matsumura et al. | |
| 4,756,977 A | 7/1988 | Haluska et al. | |
| 4,999,397 A | 3/1991 | Weiss et al. | |
| 5,010,159 A | 4/1991 | Bank et al. | |
| 5,853,808 A | 12/1998 | Arkles et al. | |
| 6,000,339 A | 12/1999 | Matsuzawa | |
| 6,232,424 B1 | 5/2001 | Zhong et al. | |
| 6,395,826 B1 * | 5/2002 | Mager et al. | 524/858 |
| 6,623,711 B2 * | 9/2003 | Lyu et al. | 423/12 |
| 6,660,822 B2 * | 12/2003 | Lyu et al. | 528/35 |
| 6,787,191 B2 * | 9/2004 | Hanahata et al. | 427/387 |
| 6,908,977 B2 * | 6/2005 | Lee et al. | 528/10 |
| 7,014,917 B2 * | 3/2006 | Lyu et al. | 428/447 |
| 7,019,099 B2 * | 3/2006 | Lyu et al. | 528/39 |

FOREIGN PATENT DOCUMENTS

| | | | |
|---|---|---|---|
| EP | 0 997 497 | | 5/2000 |
| EP | 1 217 649 | * | 6/2002 |

OTHER PUBLICATIONS

English language abstract WO 01/74957, Nov. 2001.*

* cited by examiner

*Primary Examiner*—Margaret G. Moore
(74) *Attorney, Agent, or Firm*—Harness, Dickey & Pierce, P.L.C.

(57) ABSTRACT

A siloxane-based resin having germanium and an interlayer insulating film for a semiconductor device formed using the same. The siloxane-based resins have a low dielectric constant in addition to excellent mechanical properties so that they are useful materials for an insulating film between interconnecting layers of a semiconductor device.

6 Claims, No Drawings

SILOXANE-BASED RESIN CONTAINING GERMANIUM AND AN INTERLAYER INSULATING FILM FOR A SEMICONDUCTOR DEVICE USING THE SAME

This non-provisional application is a divisional of Ser. No. 10/734,179, filed Dec. 15, 2003 now U.S. Pat. No. 7,057,002 which claims priority under 35 U.S.C. § 119(a) on Korean Patent Application No. 2003-47731 filed on Jul. 14, 2003, both of which are herein incorporated by reference.

BACKGROUND OF THE INVENTION

This non-provisional application claims priority under 35 U.S.C. § 119(a) on Korean Patent Application No. 2003-47731 filed on Jul. 14, 2003, which is herein incorporated by reference.

1. Field of the Invention

The present invention relates to a siloxane-based resin and an interlayer insulating film for a semiconductor device formed using the same. More specifically, the present invention relates to a siloxane-based resin containing germanium and a resinous film useful as an insulating film between interconnecting layers of a semiconductor device.

2. Description of the Related Art.

As the circuit density of multilevel integrated circuit devices increases, the size feature of a semiconductor device is constantly required to be reduced. The chief obstacle to the feature of size reduction of a semiconductor device is the R(resistance)×C(capacitance) delay due to crosstalk between interconnecting layers. A solution to this problem is to lower the dielectric constant of interlayer insulating films so as to decrease the R×C delay as much as possible. So, there have been various attempts to provide an insulating film having a low dielectric constant.

Conventionally, in the field of semiconductor devices, interlayer insulating films have been formed by a CVD (chemical vapor deposition) method using $SiO_2$ having a dielectric constant of 4.0. However, U.S. Pat. Nos. 3,615,272; 4,399,266; 4,756,977 and 4,999,397 disclose the formation of insulating films by the SOD (spin on deposition) method using polysilsesquioxanes having dielectric constants of 2.5–3.1 as well as good planarization properties.

Hydrogen silsesquioxanes as well as preparation methods thereof are well known in the art. For example, U.S. Pat. No. 3,615,272 discloses a method of preparing a completely condensed, soluble hydrogen silsesquioxane resin, which comprises the steps of condensing trichlorosilanes in a sulfuric acid medium and washing the resulting resin with water or aqueous sulfuric acid. Also, U.S. Pat. No. 5,010,159 discloses a method of synthesizing a soluble condensed hydrogen silsesquioxane resin, which comprises the steps of hydrolyzing hydrosilanes in an arylsulfuric acid hydrate-containing hydrolysis medium and contacting the resulting resin with a neutralizing agent. U.S. Pat. No. 6,232,424 describes a highly soluble silicon resin composition having excellent solution stability, which is prepared by hydrolyzing and polycondensing tetraalkoxysilane, organosilane and organotrialkoxysilane monomers in the presence of water and a catalyst. U.S. Pat. No. 6,000,339 describes that a silica-based compound is useful for improving the resistance to oxygen plasma and physical properties as well as the thickness of a coating film, which can be obtained through reacting a monomer selected from the group consisting of alkoxysilane, fluorine-containing alkoxysilane and alkylalkoxysilane with a titanium- or zirconium-alkoxide compound in the presence of water and a catalyst. U.S. Pat. No. 5,853,808 discloses that siloxane and silsesquioxane polymers useful for forming a $SiO_2$-rich ceramic coating can be obtained from hydrolysis and polycondensation of organosilanes having a β-substituted alkyl group. Meanwhile, EP 0 997 497 A1 discloses that hydrolyzation and polycondensation of a certain combination of alkoxysilanes including mono-, di-, tri-, tetraalkoxysilane and trialkoxysilane dimers can provide resinous materials for insulating films.

SUMMARY OF THE INVENTION

The present invention features the production of a siloxane-based resin having excellent mechanical properties as well as a very low dielectric constant, and the formation of a low dielectric insulating film using the siloxane-based resin.

That is, the present provides a siloxane-based resin having superior mechanical properties, wherein a germanium-containing monomer, subjected to sol-gel polymerization, is provided to increase the mechanical properties with no reduction of the dielectric constant of the siloxane-based resin. The germanium monomer has twice the density compared with the siloxane-based monomer, and thus can provide an improvement in the mechanical properties.

One aspect of the present invention relates to a siloxane-based resin that is prepared by hydrolyzing and polycondensing a first monomer of the Formula 1 and a second monomer of Formula 2. in an organic solvent in the presence of an acid or alkaline catalyst and water:

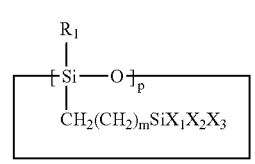

Formula 1 wherein, $R_1$ is a hydrogen atom, a $C_{1-3}$ alkyl group, or a $C_{6-15}$ aryl group;

$X_1$, $X_2$ and $X_3$ are independently a $C_{1-3}$ alkyl group, a $C_{1-10}$ alkoxy group, or a halogen atom, provided that at least one of $X_1$, $X_2$ and $X_3$ is hydrolysable;

is an integer of 3–8; and m is an integer of 0–10, and

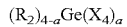

Formula 2 wherein, $R_2$ is a hydrogen atom, a $C_{1-3}$ alkyl group, or a $C_6$–$C_{15}$ aryl group;

$X_4$ is a $C_{1-10}$ oxy group, or a halogen atom; and a is an integer of 1–4.

Another aspect of the present invention relates to a method of forming an insulating film between interconnecting layers of a semiconductor device, the method comprising the steps of: providing a resin solution by dissolving the inventive siloxane-based resin in an organic solvent; coating a silicon wafer with the resin solution; and heat-curing the resulting coating film.

Still another aspect of the present invention relates to an interlayer insulating film made using the inventive siloxane-based resin.

All of the above features and other features of the present invention will be successfully achieved by following the teachings of the present invention described in the following.

DESCRIPTION OF THE PREFERRED INVENTION

The present invention provides a siloxane-based resin having a dielectric constant of 3.0 or less through the polycondensation of a cyclic siloxane monomer of the Formula 1 and a compound containing germanium of the Formula 2:

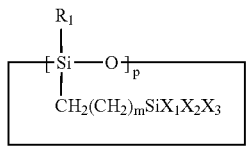

Formula 1 wherein, $R_1$ is a hydrogen atom, a $C_{1-3}$ alkyl group, or a $C_{6-15}$ aryl group;

each of $X_1$, $X_2$ and $X_3$, independently, are a $C_1$–$C_3$ alkyl group, a $C_1$–$C_{10}$ alkoxy group, or a halogen atom; provided that at least one of them is hydrolysable;

p is an integer of 3–8; and m is an integer of 0–10; and

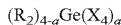 Formula 2 wherein, $R_2$ is a hydrogen atom, a $C_{1-3}$ alkyl group, or a $C_{6-15}$ aryl group;

$X_4$ is a $C_{1-10}$ alkoxy group, a halogen atom; and a is an integer of 1–4.

In the preparation of the inventive siloxane-based resin, the monomer of the Formula 1 and the monomer of the Formula 2 are mixed in a molar ratio of 1:99–99:1.

Preferable acid or base catalyst for the preparation of the inventive siloxane-based resin can be exemplified by, but are not limited to, hydrochloric acid, nitric acid, benzene sulfonic acid, oxalic acid, formic acid, potassium hydroxide, sodium hydroxide, triethylamine, sodium bicarbonate and pyridine. Such a catalyst is used so that molar ratio of the catalyst to the monomers is 0.00001:1–10:1.

The amount of water used in the preparation of the inventive siloxane-based resin is 1–1000 mol per 1 mol of the monomers, so that molar ratio of water-to the monomers is 1:1–100:1.

Non-limiting examples of the organic solvent used in the preparation of the inventive siloxane-based resin include aliphatic hydrocarbon solvents such as hexane; aromatic hydrocarbon solvents such as anisole, mesitylene and xylene; ketone-based solvents such as methyl isobutyl ketone, 1-methyl-2-pyrrolidinone and acetone; ether-based solvents such as cyclohexanone, tetrahydrofuran and isopropyl ether; acetate-based solvents such as ethyl acetate, butyl acetate and propylene glycol methyl ether acetate; alcohol-based solvents such as isopropyl alcohol and butyl alcohol; amide-based solvents such as dimethylacetamide and dimethylformamide; silicon-based solvents; and mixtures thereof.

According to the present invention, the hydrolysis and polycondensation reaction is carried out at a temperature of 0–200° C., for 0.1–100 hrs, preferably 5–48 hrs.

The siloxane-based resin thus prepared has Mw of 3,000–300,000.

The present invention also provides a method of forming an interlayer insulating film for a semiconductor device using the inventive siloxane-based resin. The insulating film has a low dielectric constant, 3.0 or less and exhibits excellent mechanical and heat resistance properties. According to the present invention, such an insulating film can be obtained by coating a silicon wafer with a solution containing the inventive siloxane-based resin in an organic solvent and heat-curing the resulting coating film. That is, the inventive siloxane-based resin dissolved in an organic solvent is applied onto a substrate. Then, the organic solvent is evaporated through simple air-drying or by subjecting the substrate, at the beginning of following heat-curing step, to vacuum conditions or to mild heating at a temperature of 200° C. or less, so that a resinous coating film can be deposited on the surface of the substrate. Thereafter, the resinous coating film is cured by heating the substrate at a temperature of 150–600° C., preferably 200–450° C., for 1–150 minutes to provide an insoluble, substantially crack-free film. As used herein, by "crack-free film" is meant a film without any crack that can be observed with an optical microscope at a magnification of 1000×. As used herein, by "insoluble film" is meant a film that is substantially insoluble in any solvent described as being useful for dissolving the inventive siloxane-based resin.

According to the present invention, the combined use of a porogen with the inventive siloxane-based resin may further lower the dielectric constant of the final insulating film down to 2.50 or less. As used herein, by "porogen" is meant any pore-generating compounds. In case of using porogen, an additional step is required of heating the resinous film over the decomposition temperature of the porogen so that the porogen can be decomposed.

The porogen used in the present invention may be any of the pore-generating compounds well known in the art, which can be exemplified by, but are not limited to, cyclodextrin, polycaprolactone, and derivatives thereof. The porogen is mixed with the inventive siloxane-based resin so that weight ratio of the porogen to the resin is 1:99–70:30, wherein both porogen and resin are in the form of solid powder.

Preferred organic solvents for the dissolution of the siloxane-based resin or the porogen to provide a liquid coating composition can be exemplified by, but are not limited to, aliphatic hydrocarbon solvents such as hexane; aromatic hydrocarbon solvents such as anisole, mesitylene and xylene; ketone-based solvents such as methyl isobutyl ketone, 1-methyl-2-pyrrolidinone and acetone; ether-based solvents such as cyclohexanone, tetrahydrofuran and isopropyl ether; acetate-based solvents such as ethyl acetate, butyl acetate and propylene glycol methyl ether acetate; alcohol-based solvents such as isopropyl alcohol and butyl alcohol; amide-based solvents such as dimethylacetamide and dimethylformamide; silicon-based solvents; and mixtures thereof.

In the preparation of the liquid coating composition, the weight ratio of solid component containing the siloxane-based resin- and the porogen is preferably 5–70 wt % based on the total composition. And the organic solvent should be used in an amount sufficient to apply the solid components including the siloxane-based resin and the porogen evenly to the surface of a wafer. Thus, the organic solvent should amount to 20–99.9 wt %, preferably 70–95 wt % of the liquid coating composition. If the organic solvent content of the liquid coating composition is less than 20 wt %, part of the siloxane-based resin remains undissolved. On the other hand, if the organic solvent content is more than 99.9 wt %, the final resinous film is as thin as 1000 Å or less.

In the present invention, the liquid coating composition thus prepared can be applied to a silicon wafer according to various coating methods well known in the art. Non-limiting examples of the coating method useful in the present invention include spin-coating, dip-coating, spray-coating, flow-coating and screen-printing, while spin-coating is most preferred.

Hereinafter, the present invention will be described in more detail with reference to the following Examples. However, these Examples are given for the purpose of illustration and are not to be construed as limiting the scope of the present invention.

EXAMPLE 1

Synthesis of Monomer

Example 1-1

Synthesis of Cyclic Siloxane-Based Monomer (A)

Monomer (A)

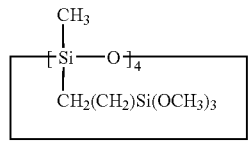

To a flask are introduced 10.0 g (29.014 mmol) of 2,4,6,8-tetramethyl-2,4,6,8-tetravinylcyclotetrasiloxane and 0.164 g of platinum(O)-1,3divinyl-1,1,3,3-tetrarmiethyldisiloxane complex (solution in xylene), and then diluted with 300 ml of diethylether. Next, the flask is cooled to −78° C., 17.29 g (127.66 mmol) of trichlorosilane is slowly added thereto, and it is slowly warmed to room temperature. The reaction is continued at room temperature for 40 hrs, and volatile materials are removed from the reaction mixture under a reduced pressure of about 0.1 Torr. To the reaction mixture is added 100 ml of hexane and stirred for 1 hr, followed by filtering through celite to afford a colorless, clear solution. From the solution is then removed hexane under a reduced pressure to afford a liquid compound represented by the following Formula:

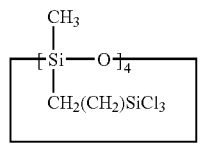

10.0 g (11.28 mmol) of the liquid compound is diluted with 500 ml of tetrahydrofuran, and 13.83 g (136.71 mmol) of triethylamine is added thereto. Thereafter, the mixture is cooled to −78° C., 4.38 g (136.71 mmol) of methyl alcohol is slowly added thereto, and it is slowly warmed to room temperature. The reaction is continued at room temperature for 15 hrs and filtered through celite, and then volatile materials are evaporated from the resulting filtrate under a reduced pressure of about 0.1 Torr. Subsequently, 100 ml of pentane is added to the remaining filtrate and stirred for 1 hr, followed by filtering through celite. To the filtrate is added 5 g of activated carbon and stirred for 10 hrs. Filtrate obtained from the filtration of the stirred solution is subjected to a reduced pressure to remove hexane therefrom and afford monomer (A) as a colorless liquid. The results obtained from NMR analysis of this monomer dissolved in $CDCl_3$ are as follows:

$^1H$ NMR(300 MHz) data; δ 0.09 (s, 12H, 4×—$CH_3$), 0.52–0.64 (m, 16H, 4×—$CH_2CH_2$—), 3.58 (s, 36H, 4×—$[OCH_3]_3$)

Example 1–2

Synthesis of Germanium-Based Monomer (B)

Monomer (B)

To a flask is introduced 19.3 g (0.1 mol) of trichloromethylgermanium, and then diluted with 500 ml of tetrahydrofuran. Next, the flask is cooled to 0° C., 35.35 g (0.35 mol) of triethylamine is added thereto, followed by the slow addition of 11.2 g (0.35 mol) of methyl alcohol. Then the reaction temperature is slowly elevated to room temperature. The reaction is continued at room temperature for 15 hrs. At the completion of the reaction, the reaction mixture is filtered through celite, and volatile materials are removed from the filtrate under a reduced pressure of about 0.1 Torr. To the remaining filtrate is added 100 ml of hexane and stirred for 1 hr, followed by filtering through celite. From the filtrate is then removed hexane under a reduced pressure to afford a colorless liquid. Colorless liquid monomer (B) is obtained from simple distillation of the liquid. The results obtained from NMR analysis of this monomer dissolved in $CDCl_3$ are as follows:

$^1H$ NMR(300 MHz) data; δ 3.6 (s, 3H)

Example 1–3

Synthesis of Germanium-Based Monomer (C)

Monomer (C)

Example 1–3 is carried out according to the same manner as in the above Example 1–2, except that methylalcohol is replaced with ethylalcohol.

The results obtained from NMR analysis of the monomer (C) thus prepared and dissolved in $CDCl_3$ are as follows:

$^1H$ NMR(300 MHz) data; δ 1.2 (t, 6H, 3×—$CH_3$), δ 3.8 (q, 9H, 3×—$CH_2$)

Example 1–4

Synthesis of Germanium-Based Monomer (D)

Monomer (D)

To a flask is introduced 21.4 g (0.1 mol) of tetrachlrorogermanium, and then diluted with 500 ml of tetrahydrofuran. Next, the flask is cooled to 0° C., 45.45 g (0.45 mol) of triethylamine is added thereto, followed by the slow addition of 14.4 g (0.45 mol) of methyl alcohol. Then the reaction temperature is slowly elevated to room temperature. The reaction is continued at room temperature for 15 hrs. At the completion of the reaction, the reaction mixture is filtered through celite, and volatile materials are removed from the filtrate under a reduced pressure of about 0.1 Torr. To the remaining filtrate is added 100 ml of hexane and stirred for 1 hr, followed by filtering through celite. From the filtrate is then removed hexane under a reduced pressure to afford a colorless liquid. Colorless liquid monomer (D) is obtained from simple distillation of the liquid. The results obtained from NMR analysis of this monomer dissolved in $CDCl_3$ are as follows:

$^1$H NMR (300 MHz) data δ 1.2 (t, 8H, 4×—$CH_3$), δ 3.8 (q, 12H, 4×—$CH_2$)

EXAMPLE 2

Synthesis of Matrix Resin

The cyclic siloxane monomer (A) and one of the linear siloxane monomers (B) through (D) obtained from the above Example 1 are quantified respectively according to Table 1 below and introduced to a flask, followed by dilution with 15× tetrahydrofuran. Subsequently, after cooling the flask down to −78° C., certain amounts of deionized water and HCl are slowly added thereto. Then, the flask is warmed to 70° C., at which temperature the flask is left for 20 hrs so that the reaction could continue. At the completion of the reaction, the reaction mixture is transferred to a separatory funnel, followed by addition of diethylether and tetrahydrofuran as much as the tetrahydrofuran used in the previous dilution of the monomer. Then, 3× washing is conducted, each round with water one tenth as much as the total solution in the separatory funnel. After washing, volatile materials are evaporated from the remaining solution to afford white powdery polymers. The powder is completely dissolved in a small amount of acetone to obtain a clear solution, and this solution is filtered through a 0.2 μm syringe filter so as to remove impurities to provide a clear filtrate; to which is then slowly added deionized water. As a result, white powdery material is formed, which is then separated from the liquid phase(mixed solution of acetone and water) and dried for 10 hrs at a temperature of 0–20° C. under a reduced pressure of about 0.1 Torr to afford a fractionated siloxane-based resin.

TABLE 1

| Siloxane Resin | Monomer (mmol) | | | | HCl(mmol) | $H_2O$(mmol) | Final Resin (g) |
|---|---|---|---|---|---|---|---|
| | (A) | (B) | (C) | (D) | | | |
| (a) | 12.32 | 9.17 | | | 0.12 | 250 | 5.76 |
| (b) | 13.87 | 11.62 | | | 0.22 | 548 | 10.7 |
| (c) | 10.55 | 4.67 | | | 0.145 | 514 | 8.77 |
| (d) | 10.55 | | 4.67 | | 0.145 | 514 | 8.43 |
| (e) | 10.55 | | | 4.67 | 0.145 | 514 | 8.12 |
| (f) | 10.55 | | | 4.67 | 0.145 | 857 | 8.34 |
| (g) | 10.55 | | | 4.67 | 0.131 | 514 | 8.03 |
| (h) | 10.55 | | | 4.67 | 0.101 | 514 | 8.55 |
| (i) | 10.55 | | | 4.67 | 0.080 | 514 | 8.34 |
| (j) | 10.55 | | | 4.67 | 0.048 | 514 | 8.07 |

EXAMPLE 3

Measurement of Thickness and Refractive Index of Thin Film

The siloxane-based resins obtained from the above Example 2, and their mixture with heptakis (2,3,6-tri-O-methoxy)-β-cyclodextrin are dissolved in propylene glycol methyl ether acetate (PGMEA), respectively, so that final concentration of the solid matter in the resulting liquid coating compositions is 25 wt %. Each of the coating compositions is then spin-coated onto a silicon wafer for 30 seconds with maintaining the spin rate of 3,000 rpm. In a nitrogen atmosphere, the coated wafers are subjected to the sequential soft baking on a hot plate (1 min at 100° C. and another minute at 250° C.) so as to evaporate the organic solvent sufficiently. Thereafter, the temperature is elevated to 420° C. at a rate of 3° C./min under vacuum condition, at which temperature the coating films are allowed to cure for 1 hr to afford test pieces.

Each of the test pieces thus prepared is analyzed for film thickness and refractive index. The film thickness and the refractive index are measured at 5 different points every test piece by the use of a profiler and a prism coupler, respectively. The mean thickness and refractive index are set forth in Table 3 along with their uniformity.

TABLE 2

Thin Film Composition

| Siloxane Resin | Resin (wt %) | Pore-forming Material (wt %) | Thick. (Å) | Refractive Index | Uniformity of R.I (%) | Uniformity of Thick.(%) |
|---|---|---|---|---|---|---|
| (a) | 100 | — | 8995 | 1.3876 | 0.088 | 1.87 |
| (a) | 70 | 30 | 9846 | 1.3775 | 0.143 | 1.34 |
| (b) | 100 | — | 10254 | 1.3891 | 0.063 | 0.76 |
| (b) | 70 | 30 | 10457 | 1.4123 | 0.044 | 1.54 |
| (c) | 100 | — | 10334 | 1.4136 | 0.021 | 0.76 |
| (c) | 70 | 30 | 9765 | 1.3543 | 0.76 | 1.21 |
| (d) | 100 | — | 10923 | 1.4113 | 0.23 | 0.23 |
| (d) | 70 | 30 | 10654 | 1.3235 | 0.192 | 1.05 |
| (e) | 100 | — | 11129 | 1.3654 | 0.022 | 1.23 |
| (e) | 70 | 30 | 10537 | 1.3247 | 0.054 | 1.54 |
| (f) | 100 | — | 11587 | 1.3675 | 0.027 | 0.78 |
| (f) | 70 | 30 | 9976 | 1.3208 | 0.054 | 0.56 |
| (g) | 100 | — | 11034 | 1.3143 | 0.046 | 0.59 |
| (g) | 70 | 30 | 9861 | 1.3221 | 0.059 | 1.16 |
| (h) | 100 | — | 11738 | 1.3023 | 0.013 | 1.45 |
| (h) | 70 | 30 | 11587 | 1.3114 | 0.049 | 1.75 |
| (i) | 100 | — | 10987 | 1.4211 | 0.051 | 1.76 |
| (i) | 70 | 30 | 9398 | 1.4367 | 0.036 | 1.08 |
| (j) | 100 | — | 11456 | 1.4178 | 0.037 | 0.84 |
| (j) | 70 | 30 | 10324 | 1.3106 | 0.056 | 0.38 |

EXAMPLE 4

Measurement of Dielectric Constant of the Thin Film

P-type silicon wafers doped with boron are coated with a 3000 Å thermally-oxidized silicon film, followed by sequential deposition of a 100 Å of titanium layer, a 2000 Å of aluminum layer and a 100 Å of titanium layer using a metal evaporator. On the surface of each of these wafers is formed a resinous film according to the same manner as in the above Example 3 in the composition of Table 3. Subsequently, on the resinous film is deposited a circular electrode of 1 m diameter which consists of a 100 Å-thick titanium layer and a 5000 Å-thick aluminum layer through a hard mask so as to provide a test piece having MIM (metal-insulator-metal) structure. Test pieces thus prepared are subjected to measurement of capacitance at 100 kHz using PRECISION LCR METER (HP4284A) with Micromanipulator 6200 probe station. Dielectric constant of each test film is calculated from the following equation, wherein "d" value is obtained by the use of an ellipsometer:

$$k = C \times d / \epsilon_0 \times A$$

wherein,
k: dielectric constant
C: capacitance
$\in_0$: dielectric constant in vacuum
d: the thickness of the low dielectric thin film
A: contact area of electrode

TABLE 3

| Thin Film Composition | | | |
|---|---|---|---|
| Siloxane Resin | Resin (wt %) | Pore-forming Material (wt %) | Dielectric Constant |
| (a) | 100 | — | 2.56 |
| (a) | 70 | 30 | 2.21 |
| (b) | 100 | — | 2.76 |
| (b) | 70 | 30 | 2.32 |
| (c) | 100 | — | 2.72 |
| (c) | 70 | 30 | 2.34 |
| (d) | 100 | — | 2.67 |
| (d) | 70 | 30 | 2.24 |
| (e) | 100 | — | 2.68 |
| (e) | 70 | 30 | 2.23 |
| (f) | 100 | — | 2.72 |
| (f) | 70 | 30 | 2.21 |
| (g) | 100 | — | 2.79 |
| (g) | 70 | 30 | 2.24 |
| (h) | 100 | — | 2.80 |
| (h) | 70 | 30 | 2.25 |
| (i) | 100 | — | 2.83 |
| (i) | 70 | 30 | 2.31 |
| (j) | 100 | — | 2.86 |
| (j) | 70 | 30 | 2.21 |

EXAMPLE 5

Measurement of Hardness and Modulus of the Thin Film

Test pieces prepared as in the above Example 4 are analyzed for hardness and elastic modulus using Nanoindenter II (MTS Co.). The resinous film of each test piece is indented until the indentation depth reached 10% of its whole thickness. At this time, to secure the reliability of this measurement, 6 points are indented every test piece, and mean hardness and modulus are taken. The results are set forth in Table 4.

TABLE 4

| Thin Film Composition | | | | |
|---|---|---|---|---|
| Siloxane Resin | Resin (wt %) | Pore-forming Material (wt %) | Hardness (GPa) | Modulus (GPa) |
| (a) | 100 | — | 0.72 | 5.11 |
| (a) | 70 | 30 | 0.45 | 3.14 |
| (b) | 100 | — | 0.75 | 5.32 |
| (b) | 70 | 30 | 0.41 | 3.23 |
| (c) | 100 | — | 1.23 | 5.65 |
| (c) | 70 | 30 | 1.02 | 3.02 |
| (d) | 100 | — | 1.10 | 5.21 |
| (d) | 70 | 30 | 0.98 | 3.65 |
| (e) | 100 | — | 1.42 | 6.58 |
| (e) | 70 | 30 | 1.11 | 3.63 |
| (f) | 100 | — | 1.34 | 6.89 |
| (f) | 70 | 30 | 0.99 | 3.87 |
| (g) | 100 | — | 1.09 | 6.52 |
| (g) | 70 | 30 | 0.77 | 3.55 |
| (h) | 100 | — | 1.17 | 6.16 |
| (h) | 70 | 30 | 0.54 | 3.67 |
| (i) | 100 | — | 1.14 | 6.21 |
| (i) | 70 | 30 | 0.59 | 3.48 |
| (j) | 100 | — | 1.04 | 6.97 |
| (j) | 70 | 30 | 0.64 | 3.30 |

COMPARATIVE EXAMPLE 1

Synthesis of Siloxane-Based Resin

The cyclic siloxane monomer (A) and one of the methyl trimethoxysilane monomer (B') or tetraethoxysilane monomer (D') are introduced to a flask, followed by dilution with 15× tetrahydrofuran. Subsequently, after cooling the flask down to −78° C., certain amounts of deionized water and HCl are slowly added thereto. Then, the flask is warmed to 70° C., at which temperature the flask is left for 20 hrs so that the reaction could continue. At the completion of the reaction, the reaction mixture is transferred to a separatory funnel, followed by addition of diethylether and tetrahydrofuran as much as the tetrahydrofuran used in the previous dilution of the monomer. Then, 3× washing is conducted, each round with water one tenth as much as the total solution in the separatory funnel. After washing, volatile materials are evaporated from the remaining solution to afford white powdery polymers. The powder was completely dissolved in a small amount of acetone to obtain a clear solution, and this solution is filtered through a 0.2 μm syringe filter so as to remove impurities to provide a clear filtrate, to which is then slowly added deionized water. As a result, white powdery material is formed, which is then separated from the liquid phase(mixed solution of acetone and water) and dried for 10 hrs at a temperature of 0–20° C. under a reduced pressure of about 0.1 Torr to afford a siloxane-based resin. The results are shown in Table 5, below.

TABLE 5

| | Monomer (mmol) | | | HCl | $H_2O$ | Final Resin |
|---|---|---|---|---|---|---|
| Composition | (A) | (B) | (C) | (mmol) | (mmol) | (g) |
| (a') | 12.32 | 9.17 | | 0.12 | 250 | 6.87 |
| (b') | 13.87 | 11.62 | | 0.22 | 548 | 8.84 |
| (c') | 10.55 | 4.67 | | 0.16 | 485 | 8.54 |
| (d') | 10.55 | | 4.67 | 0.145 | 514 | 7.89 |
| (e') | 10.55 | | 4.67 | 0.145 | 857 | 8.23 |
| (f') | 10.55 | | 4.67 | 0.131 | 514 | 8.98 |

COMPARATIVE EXAMPLE 2

Measurement of Dielectric Constant

Test pieces prepared as in the above comparative Example 1 are analyzed for thickness and refractive index using the same manner as the above Example 3, then analyzed for dielectric constant using the same manner as the above Example 4. The results are set forth in Table 6.

TABLE 6

Thin Film Composition

| Siloxane Resin | Resin (wt %) | Pore-forming Material (wt %) | Dielectric Constant |
|---|---|---|---|
| (a) | 100 | — | 2.56 |
| (a) | 70 | 30 | 2.21 |
| (b) | 100 | — | 2.76 |
| (b) | 70 | 30 | 2.32 |
| (c) | 100 | — | 2.72 |
| (c) | 70 | 30 | 2.34 |
| (e) | 100 | — | 2.68 |
| (e) | 70 | 30 | 2.23 |
| (f) | 100 | — | 2.72 |
| (f) | 70 | 30 | 2.21 |
| (g) | 100 | — | 2.79 |
| (g) | 70 | 30 | 2.24 |
| (a') | 100 | — | 2.54 |
| (a') | 70 | 30 | 2.22 |
| (b') | 100 | — | 2.81 |
| (b') | 70 | 30 | 2.32 |
| (c') | 100 | — | 2.85 |
| (c') | 70 | 30 | 2.31 |
| (d') | 100 | — | 2.69 |
| (d') | 70 | 30 | 2.29 |
| (e') | 100 | — | 2.73 |
| (e') | 70 | 30 | 2.23 |
| (f') | 100 | — | 2.81 |
| (f') | 70 | 30 | 2.34 |

COMPARATIVE EXAMPLE 3

Measurement of Hardness and Modulus

Test pieces prepared as in the above comparative Example 1 are analyzed for thickness and refractive index using the same manner as the above Example 3, then analyzed for hardness and elastic modulus using the same manner as the above Example 5. The results are set forth in Table 7.

TABLE 7

Thin Film Composition

| Siloxane Resin | Resin (wt %) | Pore-forming Material (wt %) | Hardness (Gpa) | Modulus (Gpa) |
|---|---|---|---|---|
| (a) | 100 | — | 0.72 | 5.11 |
| (a) | 70 | 30 | 0.45 | 3.14 |
| (b) | 100 | — | 0.75 | 5.32 |
| (b) | 70 | 30 | 0.41 | 3.23 |
| (c) | 100 | — | 1.23 | 5.65 |
| (c) | 70 | 30 | 1.02 | 3.02 |
| (e) | 100 | — | 1.42 | 6.58 |
| (e) | 70 | 30 | 1.11 | 3.63 |
| (f) | 100 | — | 1.34 | 6.89 |
| (f) | 70 | 30 | 0.99 | 3.89 |
| (g) | 100 | — | 1.09 | 6.52 |
| (g) | 70 | 30 | 0.77 | 3.55 |
| (a') | 100 | — | 0.51 | 4.21 |
| (a') | 70 | 30 | 0.31 | 3.84 |
| (b') | 100 | — | 0.59 | 4.67 |
| (b') | 70 | 30 | 0.34 | 3.54 |
| (c') | 100 | — | 0.98 | 5.44 |
| (c') | 70 | 30 | 0.82 | 3.54 |
| (e') | 100 | — | 1.12 | 6.12 |
| (e') | 70 | 30 | 0.43 | 2.99 |
| (f') | 100 | — | 1.09 | 6.23 |
| (f') | 70 | 30 | 0.68 | 3.35 |
| (g') | 100 | — | 0.87 | 6.18 |
| (g') | 70 | 30 | 0.43 | 3.27 |

As apparent from Examples and Comparative Examples, the siloxane-based resin having germanium has relatively high hardness and modulus with a low dielectric constant.

Although the preferred embodiments of the present invention have been disclosed for illustrative purposes, those skilled in the art will appreciate that various modifications, additions and substitutions are possible, without departing from the spirit and scope of the invention as recited in the accompanying claims.

What is claimed is:

1. A method of forming an insulating film between interconnecting layers of a semiconductor device, the method comprising the steps of:
providing a liquid coating composition by dissolving a siloxane-based resin in an organic solvent, wherein the siloxane-based resin is prepared by hydrolyzing and polycondensing a first monomer of a Formula 1 and a second monomer of a Formula 2 in an organic solvent in the presence of an acid or alkaline catalyst and water;
coating a silicon wafer with the liquid coating composition to form a coating film thereon; and
heat-curing the coating film,
wherein the Formula 1 is

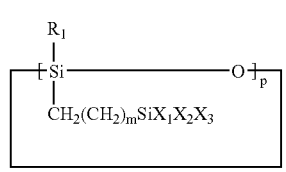

Formula (1)

wherein $R_1$ is a hydrogen atom, a $C_{1-13}$ alkyl group or a $C_{6-15}$ aryl group; each of $X_1$, $X_2$ and $X_3$, independently, is a $C_{1-3}$ alkyl group, a $C_{1-10}$ alkoxy group or a halogen atom provided at least one of said $C_{1-3}$ alkyl group, said $C_{1-10}$ alkoxy group or said halogen atom is hydrolysable; m is an integer from 0 to 10; and p is an integer from 3 to 8; and the Formula 2 is

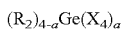   Formula (2)

wherein $R_2$ is a hydrogen atom, a $C_{1-3}$ alkyl group or a $C_{6-15}$ aryl group; $X_4$ is a $C_{1-10}$ alkoxy group or a halogen atom; and a is an integer of 1–3.

2. The method according to claim 1, wherein the siloxane-based resin is mixed with a porogen so that the weight ratio of the resin to the porogen is 99:1–30:70.

3. The method according to claim 2, wherein the porogen is cyclodextrin, polycaprolactone, or derivatives thereof.

4. The method according to claim 2, wherein the weight ratio of solid component containing the siloxane-based resin and the porogen is 5–70 wt % based on the total composition.

5. The method according to claim 1, wherein the heat-curing is performed at 150–600° C. for 1–150 minutes.

6. The method of claim 1, wherein the insulating film has a dielectric constant of 3.0 or less.

* * * * *